United States Patent [19]

Laub et al.

[11] Patent Number: 4,865,375
[45] Date of Patent: Sep. 12, 1989

[54] GRIPPER HEAD

[75] Inventors: Michael F. Laub, Harrisburg; Carl D. Sterner, Mt. Wolf, both of Pa.

[73] Assignee: AMP Incorporated, Harrisburg, Pa.

[21] Appl. No.: 207,406

[22] Filed: May 31, 1988

[51] Int. Cl.[4] .............................................. B25J 15/08
[52] U.S. Cl. ....................................... 294/88; 294/93;
294/119.1; 29/741; 901/37
[58] Field of Search ......................... 294/119.1, 88, 93;
901/31, 37, 39, 40; 414/729, 730, 741, 737, 744,
752; 269/25, 156; 29/741

[56] References Cited

U.S. PATENT DOCUMENTS

| | | |
|---|---|---|
| 4,611,377 | 9/1986 | McCormick et al. . |
| 4,611,846 | 10/1986 | Feiber et al. . |
| 4,715,112 | 12/1987 | Jackson et al. . |
| 4,718,165 | 1/1988 | Reuss . |
| 4,750,261 | 6/1988 | Letsch et al. . |
| 4,802,816 | 2/1989 | Mezhinsky ...................... 294/119.1 |

FOREIGN PATENT DOCUMENTS 0162439 11/1985 European Pat. Off. .
2041262 9/1980 United Kingdom .

*Primary Examiner*—Johnny D. Cherry
*Attorney, Agent, or Firm*—Katherine A. Nelson

[57] ABSTRACT

A gripper head (18) for use, for example, with a pick and place robot (2) comprises a body (26) comprising a pair of housings (28) each containing a pneumatic piston and cylinder unit (62) and being connected together by means of a slide plate (30). The piston and cylinder units (62) are arranged in opposed relationship on opposite sides of a central vertical axis (Z) of the body (26). The slide plate (30) defines in cooperation with a top cover (32) a slideway (48) receiving slides (82) from which depend side plates (76) connected to gripper jaws (98). The slides (82) are positively connected by a link (92) which is pivotable about a pin (88) coincident with the central axis (Z). Pins (96) on the link (92) engage in transverse slots (86) in the slides (82) to ensure that the jaws (98) are moved by piston rods (66) of the piston and cylinder units (62), always simultaneously and by the same distance, between an open position to receive an electrical connector (C′) and a closed position to grip it.

20 Claims, 3 Drawing Sheets

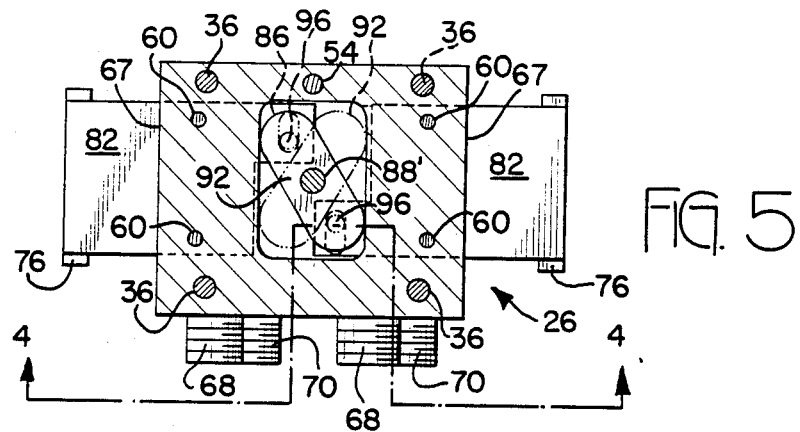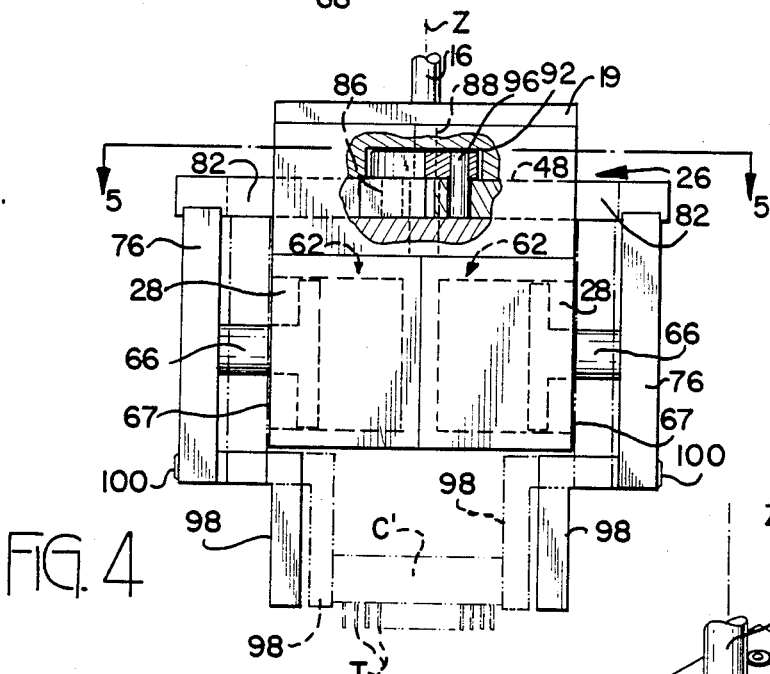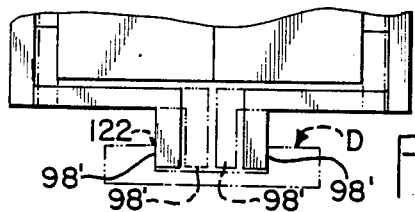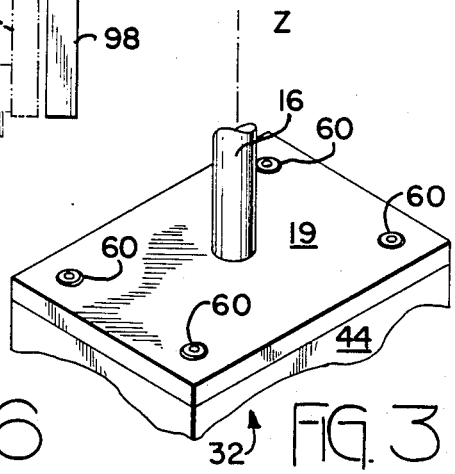

GRIPPER HEAD

FIELD OF THE INVENTION

This invention relates to a gripper or pick-up head for use in gripping or picking up objects and in particular electrical connectors, and holding and/or placing them in predetermined positions. In use, such a pick-up head may be attached to the Z-axis shaft, that is to say the shaft which is moved along a vertical axis, of a pick and place robot or other pick and place machine.

Such machines are commonly used in industrial production, for transporting objects from pick-up stations to a work piece and assembling them thereto in accordance with a predetermined program, usually under the control of a microprocessor which ensures correct sequential operation of the parts of the machine and of the pick-up head.

BACKGROUND OF THE INVENTION

There is described in U.S. Pat. No. 4,611,846 such a pick-up head, which comprises a body having a central axis and means for attaching the body to said Z-axis shaft with a central axis of the body coincident with the axis of the shaft. First and second pneumatic piston and cylinder units are arranged in the body in opposed relationship, one on each side of the central axis thereof. First and second jaws, one disposed on each of two opposite sides of the central axis are each connected to, and slidably drivable by, the piston of a respective one of said units, along a path of travel in a direction towards and away from said central axis, each jaw projecting from the body in a direction away from said attachment means.

A brake is provided for retaining one of the jaws in a predetermined position along its path of travel. When an object is to be picked up by the jaws, the pick-up head is lowered by the shaft, to position the object between the jaws, with the brake applied, and the other jaw is moved by its piston and cylinder unit towards the one jaw, to cause the object to be gripped between the jaws. Said one jaw is that jaw which is located in the direction of movement of the shaft, when it is swung to place the object gripped by the jaws in said predetermined position. Said retaining means ensures that said one jaw is not displaced as a result of the rapid translatory movement of the shaft, bearing in mind, that the piston and cylinder units are pneumatic. There is also disclosed in U.S. Pat. No. 4,718,165 a pick-up head for picking up elongate electrical connectors having a contact tail depending therefrom and for placing the connectors on circuit boards to insert the contact tails through holes therein. The pick-up head comprises a frame having a vertical axis and means for attaching the framework to the Z-axis shaft of a pick and place robot with the vertical axis coincident with the axis of the Z-axis shaft. Connector gripping jaws of the pick-up head are operated by the piston and cylinder units connected to one of the jaws for moving the jaws towards and away from one another. The piston and cylinder units are arranged in spaced parallel relationship in the frame.

SUMMARY OF THE INVENTION

In a gripper or pick-up head according to the invention, pneumatic piston and cylinder units are arranged in opposed relationship in a gripper head body having a central axis and means for attaching it, for example to a longitudinally moveable shaft, such as the Z-axis shaft of a pick and place robot. It is to be understood that the gripper or pick-up head may be mounted to a stationary apparatus as well as a movable one. For purposes of illustration, the head will be described in terms of use with a pick and place robot. The said units, which are arranged on opposite sides of the central axis, are each connected to one of the jaws for moving the jaws towards one another to grip an object, for example an electrical connector, to be picked up and placed in a predetermined position, and away from one another to release the object when it has been so placed. Each jaw is fixed to a slide in a slideway in the body, the slides are connected by synchronizing means which ensure that the slides and thus the jaws are simultaneously moved by equal distances, both towards and away from one another by the pneumatic piston and cylinder units. The object, for example, an electrical connector, to be picked up and placed, is therefore precisely positioned, so as to be bisected by said central axis when the object has been gripped between the jaws. By virtue of the synchronizing means, a brake for retaining one of the jaws in a predetermined position along its path of travel, is not required and the programming of the microprocessor which controls the robot is simplified.

Alternatively, the jaws for the gripper head may be designed so that they pick up an object by moving outwardly away from each other and release the object by moving inwardly toward each other. Obviously, the design of the jaws mounted to the gripper head will depend upon the object that is to be picked up or held. The embodiments discussed herein are representative examples only.

In further alternative arrangement, the gripper head may be used has a "holding means" wherein the head is mounted in a stationary position and programmed such that the jaws move to grip an article that is moved into position between the open jaws. For example, a number of heads may be mounted in an assembly line to hold articles that are moved sequentially from one position to another along the line as various steps of the manufacturing process are performed on the articles as they are held by the heads.

The gripper head according to the invention, admits of a simple, robust, and economical construction, whereby the body is provided by housings of the piston and cylinder units which housings are connected together by means of the slideway, which may be in the form of a slideway plate fastened to the housings, by means of fasteners passed through a slideway cover which also enclosed the synchronizing means. The jaws may be exchangeably mounted on jaw carrier plates fixed to the slides and extending at right angles thereto. The housings of the piston and cylinder units are preferably rectangular and are secured together by the slideway plate in contiguous relationship to provide a rigid structure. The body may therefore comprise a minimum of separate parts.

The synchronizing means may comprise a link centrally pivoted to the body and being pivotally connected at each end to a respective one of the slides, through lost motion means, for example the pins on the link, engaging in transverse slots in the slides.

BRIEF DESCRIPTION OF THE DRAWINGS

For a better understanding of the invention and to show how it may be carried into effect, reference will now be made by way of example to the accompanying drawings to which:

FIG. 3 is a fragmentary isometric view showing the pick-up head assembled to the Z-axis shaft of the robot;

FIG. 4 is a front view of the pick-up head shown partly in section on the lines 4—4 of FIG. 5 in association with an electrical connector to be picked up and placed by means of the pick-up head;

FIG. 5 is a view taken on the lines 5—5 of FIG. 4; and

FIG. 6 is a fragmentary front view showing an alternative embodiment of the pick-up head.

DETAILED DESCRIPTION OF THE INVENTION

Figure 1:
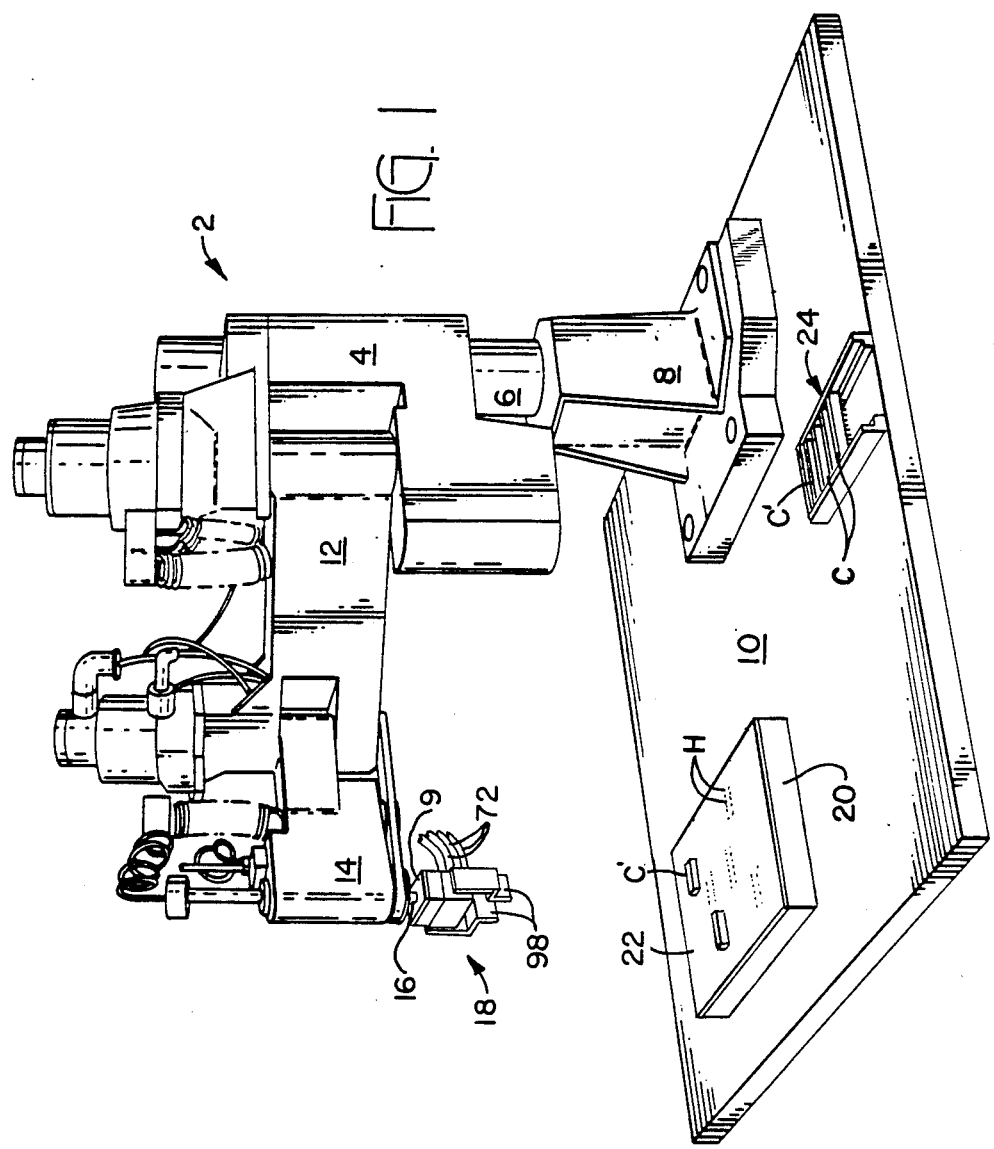
FIG. 1 is a diagrammatic perspective view of a pick and place robot having a pick-up head according to an embodiment of the invention, the robot being shown in use in the assembly of electrical connectors to a printed circuit board.

As shown in FIG. 1, a robot 2 comprises a body 4 mounted for rotation about, and movement along, the axis of a vertical shaft 6 in a stand 8 secured to a work table 10. Mounted on the body 4 for rotation about a vertical axis, is a first arm 12 carrying at its end remote from the body 4, a second arm 14 which is rotatable relative to the arm 12, also about a vertical axis. A shaft 16 which is rotatable about a vertical axis and which is also extensible and retractable along such access depends from the arm 14 at its end remote from the arm 12. The axis of the shaft 16 is known as the Z-axis of the robot. The body 4 is clamped, prior to use of the robot 2, in a desired angular position, and in a desired vertical position, with respect to the shaft 6. The rotation of the arms 12 and 14, the shaft 16, as well as the axial vertical movement of the shaft 16, are selectively controllable by means of a C microprocessor (not shown) in accordance with a predetermined program.

A gripper or pick-up head 18, according to an embodiment of the invention, is fixedly mounted on the shaft 16 by means of a mounting plate 19 secured thereto and to the pick-up head 18.

A workpiece support 20 on the table 10 supports and locates, in a fixed position thereon, a workpiece in the form of a printed circuit board 22. On the work table 10 is a pick-up station 24 containing electrical connectors C to be mounted at accurately predetermined positions on the board 22.

The robot 2 is operated under the control of the microprocessor to swing the head 18 over the pick-up station 24, to lower the head 18 to engage the leading connector at the station 24, C' therefor, to cause the head 18 to grip that connector, to raise the head 18, to swing the head 18 to a position over the board 22, to lower the head 18 to position the connector C' on the board 22, to cause the head 18 to release the connector C', to raise the head 18, and subsequently to cause the head 18 to pick up another connector form the station 24 in a manner similar to that described above, and so on.

Figure 2:
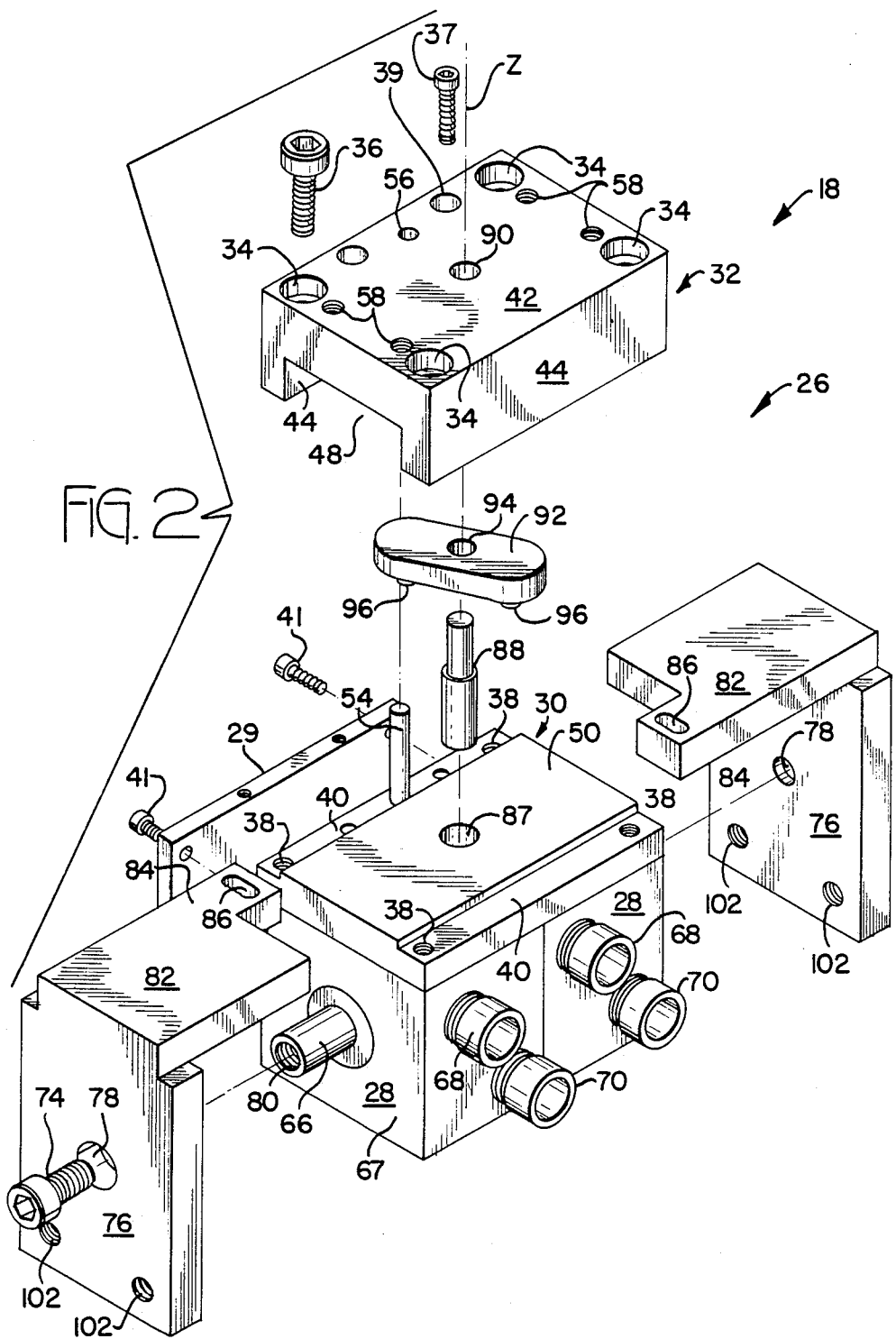
FIG. 2 is an isometric, exploded view of the pick-up head shown in FIG. 1.

The pick-up head 18 will now be described in detail with reference to FIGS. 2 to 5. The pick-up head 18 comprises a body 26 which is made up of a pair of rectangular metal housings 28 connected together in contiguous relationship by means of a back plate 29, which is attached to metal slideway plate 30 and a metal slideway cover 32 secured to the slideway plate 30. The slideway cover 32 has countersunk through holes 34 through which are passed fasteners in the form of screws 36 (only one of which is shown in FIG. 2) which are threaded into tapped openings 38 in lateral flanges 40 of the plate 30, and holes 39 for screws 37 which are threaded into tapped openings (not shown), in the back-plate 29. Screws 41 (two are shown in FIG. 2) are inserted through the back plate 29 and are threaded into tapped openings (not shown) in housings 28. Thus, the cover 32, the plate 30, the backplate 29 and the housings 28 are all secured together to provide a robust, rigid rectangular structure. The cover 32 comprises a rectangular top wall 42, opposed side walls 44 depending below the wall 42, defining in cooperation therewith and with a raised, flat, slideway surface 50 of the plate 30, an elongate slideway 48 extending normally of a central vertical axis Z of the body 26. The assembly of the cover 32, in accurate alignment with the plate 30, is assisted by an alignment dowel pin 54 projecting from one of the flanges 40 of the plate 30 for engagement in a through hole 56 in the top wall 42. The top wall 42 has at each end thereof, means, in the form of tapped openings 58, for receiving screws 60 for securing the mounting plate 19, which is secured to the Z-axis shaft 16 of the robot 2, to the top wall 42 of the cover 32, with the central vertical axis Z of the body 26 coincident with the axis of the shaft 16.

In each housing 28 is a pneumatic piston and cylinder unit 62 (indicated in broken lines in FIG. 4) having a piston 64 to which is connected a piston rod 66, the units 62 being mounted in the body 26 in opposed relationship and on opposite sides of the axis z and being therefore oppositely acting, with their piston rods 66 in axial alignment and extending normally of the axis Z through outer end faces 67 of the housings 28. Each of the units 62 has an inlet port 68 and an outlet port 70, connected to respective pneumatic lines 72 (FIG. 1) leading into the robot 2, for the control of the units 62 in accordance with the said predetermined program.

There is secured to each piston rod 66 by means of a screw 74 (only one of which is shown), a jaw carrier plate 76 parallel to the adjacent face 67, each screw 74 extending through a through central opening 78 in the plate 76 and being threadedly received in a tapped axial bore 80 in the piston rod 66. Formed integrally with the upper edge of each plate 76 is a slide 82 extending normally thereof. There projects from the edge 83 of each slide 82, remote from the plate 76, a rectangular projection lug 84, the slides 82 being arranged in rotation symmetry so that the projection lugs 84 thereof are offset from one another in a direction at right angles to the axis Z, a transverse slot 86 formed in each lug 84, also extending normally of the axis Z. The slides 82 are received in the slideway 48 in opposed relationship, being slidable therein normally of the axis Z.

There opens into the surface 50 of the plate 30 a central bore 87, coincident with the axis Z, and receiving a pivot pin 88 the axis of which is also coincident with the axis Z. The pin 88 extends through the slideway 48 and through a central through hole 90, in the top wall 42 of the cover 32. Within the slideway 48 is an elongate, flat, link 92 having a central through opening 94 receiving the pin 88, so that the link 92 is pivotable about the axis Z, the pin 88 being positioned at the longitudinal and the transverse center of the link 92. There depends normally from the link 92, proximate to each end thereof, a pivot pin 96, the pins 96 being equidistant from the pin 88 and thus from the axis Z, each pin 96 pivotably engaging in a respective one of the slots 86.

Fixed by means of bolts 100 to the lower end of each plate 76 is an L-shaped connector gripper jaw 98 (FIGS. 1 and 4). The bolts 100 are inserted into openings (not shown) in the jaws 98 and into tapped openings 102 in the plates 76.

When a leading connector C' which has two rows of contact tails T (only one row is shown), depending therefrom, is to be picked up by the head 18, the units 62 are actuated, according to the predetermined program, to advance their piston rods 66 so that the plate 76 and thus the jaws 98 are moved to an open position which is shown in full lines in FIGS. 4 and 5. In that position each plate 76 is spaced by an equal distance, for example by 0.25 inches (0.623 cm) away from the adjacent face 67. As the link 92 is centrally pivoted about the axis Z, and the pins 96 are equidistant therefrom, the slides 82 and thus the plates 76 and the jaws 98 are moved simultaneously, at the same speed, and to precisely the same extent to the open position. The robot 2 lowers the shaft 16 according to the program, so that the jaws 98 are positioned on either side of the connector C' as shown in full lines in FIG. 4. The units 62 are then actuated to retract their piston rods 66 so that the plated 76 and thus the jaws 98 are moved to closed positions as indicated in broken lines in FIG. 4 whereby the connector C' is gripped between the jaws 98. In said closed position the plates 76 abut the faces 67. Since the plates 76 and thus the jaws 98 are moved towards one another to the same extent since the pin 88 on the axis Z is positioned centrally of the link 92 and the pins 96 are equidistant from the pin 88, the jaws 98 are moved towards one another simultaneously and by the same distance to engage the connector C', and the latter is positioned precisely centrally of the axis Z. The link 92 is shown in full lines in FIG. 5 in the open position of the jaw 98 and in broken lines in their closed position.

In accordance with the program, the robot 2 is now actuated to raise the shaft 16 and thus the head 18 and to swing it to a predetermined position over the board 22 at the station 20 and then to lower the shaft 16 so that each contact tail T of the connector C' is inserted into a respective hole H in the board 22. Since the connector C' has two rows of contact tails T, the holes H are, as shown in FIG. 1, arranged in two parallel rows. Since the connector C' is bisected by the axis Z, as mentioned above, the robot 2 can be programmed to position the axis of the shaft 16 precisely at the longitudinal and transverse center of the rows of holes H.

The tails T having been inserted in the respective holes H, the units 62 are actuated, according to the program, to advance their piston rods 66 to open the jaws 98 and thus to release the connector C', leaving it positioned on the board 22, after which the robot 2 returns the head 18 to the station 24 to pick up a further connector therefrom.

FIG. 6 shows an alternative arrangement of the jaw members 98' wherein the jaws 98' pick up or hold a device D by moving outwardly to engage inner surfaces of a cavity 122 within device D. Device D is released by moving the jaws 98' toward each other as shown by the phantom lines. It will be appreciated by those in the art that many modifications can be made in the shape and type jaws attached to the pick-up head. It will be further appreciated by those in the art that one or more gripper heads may be used as stationary grippers in an assembly line to hold articles as various steps in the assembly progress are performed.

Obviously, many modifications may be made without departing from the basic spirit of the present invention.

We claim:

1. A pick-up head for use in the picking up objects and placing them in predetermined positions, the pick-up head comprising:

a body having a central axis and means for attaching the body to a longitudinally movable shaft, with said central axis coincident with the axis of the shaft;

first and second pneumatic piston and cylinder units arranged in the body in opposed relationship, one on each side of said central axis and each having a piston rod which is movable in a direction at right angles to that axis;

first and second pick-up jaws disposed on respective ones of said sides of said central axis, each jaw being connected to, and being drivable by, the piston rod of the piston and cylinder unit on the same side of the central axis as said jaw, between an open position and a closed position;

a slideway in said body, extending at right angles to said central axis and in the direction of movement of said piston rods;

a slide fixed to each jaw and being slidable along said slideway, in opposed relationship to the slide fixed to the other jaw; and synchronizing means positively connecting said slides for simultaneous movement by said piston rods and to the same extent between said open and said closed positions, said synchronizing means comprising an elongate link, a pin in said body, which pin is coincident with said central axis, and with the longitudinal and the transverse center of said link, said link being pivotable about said pin and thus about said central axis, and lost motion means pivotally connecting each end of said link to a respective one of said slides.

2. The pick-up head as claimed in claim 1, wherein said jaws receive said object in said open position and grip said objects in said closed position.

3. The pick-up head as claimed in claim 1, wherein said pin in said body comprises a first pivot pin extending along said central axis, said elongate link having second and third pivot pins on opposed ends thereof, said second and third pivot pins being parallel to said first pivot pin, and each engaging in an elongate slot in a respective one of the slides, each slot extending transversely of said slideway, said second and third pivot pins being equidistant from said first pivot pin.

4. The pick-up head as claimed in claim 3, wherein said slides have opposed offset projections, each elongate slot being formed in one of said projections, said projections overlapping one another in the closed position of said jaws.

5. The pick-up head as claimed in claim 1, wherein said slideway is defined between a plate fixed to respective housings of said piston and cylinder units, and a cover fixed to said plate and enclosing said synchronizing means.

6. The pick-up head as claimed in claim 1, wherein said body consists of a pair of rectangular abutting housings for said piston and cylinder units, a plate and a cover for said synchronizing means, said plate and said cover defining said slideway.

7. The pick-up head as claimed in claim 6, wherein each jaw is carried by a jaw carrier plate extending at right angles from a respective one of said slides, each jaw carrier plate being secured to one of said piston rods and extending parallel to a face of one of said housings, through which face the piston rod projects.

8. The pick-up head as claimed in claim 1, wherein said jaws receive said object in said closed position and grip said objects in said open position.

9. A pick-up head for use in picking up electrical connectors having contact tails depending therefrom and placing the connectors on circuit boards to insert the contact tails thereof into respective holes in the boards, the pick-up head comprising:
- a body having an upper and lower face, a central vertical axis, and means for attaching the body to the Z-axis shaft of a pick and place robot with said vertical axis coincident with the axis of said shaft;
- a pair of connector gripping jaws on said body, and being moveable relative thereto between an open, connector receiving position and a closed, connector gripping position;
- a pair of pneumatic piston and cylinder units mounted in said body in opposed relationship and each having a piston rod connected to a respective one of said jaws and extending normally of said central axis, said units being actable to move said jaws between said open and said closed positions, each of said units being enclosed in a respective housing;
- a slideway proximate to the upper face of the body and extending there across at right angles to said central axis, said slideway being supported by said respective housings of said units;
- a slide fixed rigidly to, and extending normally of, each jaw and being slidable along the slideway, said slides being arranged in opposed relationship thereon;
- a top cover for said slides; and
- synchronizing linkage means positively connecting said slides for simultaneous movement and by equal distances, to move said jaws between their open and their closed positions, said linkage means being provided with said attachment means.

10. The pick-up head as claimed in claim 9, wherein said housings are rectangular and are connected together by means of a slideway plate with first walls of the housings in abutting relationship, said piston rods extending through second walls of said housings which are opposite to said first walls, said jaws being carried by jaw carrier plates extending at right angles to said slides and being fixed thereto and said jaws being exchangeably connected to said jaw carrier plates.

11. The pick-up head as claimed in claim 9, wherein said attachment means comprise tapped openings in said cover, for receiving fasteners for securing a plate fixed to said axis shaft, to said cover.

12. The pick-up head as claimed in claim 11, wherein an alignment pin on said slideway plate projects into a hole in said cover to align it with said housings.

13. The pick-up head as claimed in claim 9, wherein said linkage means comprise a link which is pivotable about said central axis and extends normally thereof, a pin proximate to each end of the link engaging in an elongate, transverse slot in a respective one of said slides, said pins being equidistant from said central axis.

14. The pick-up head as claimed in claim 9, wherein said jaws receive said object in said open position and grip said objects in said closed position.

15. A gripper head for use in gripping objects and holding them in predetermined positions, the gripper head comprising:
- a body consisting of a pair of juxtaposed pneumatic piston and cylinder unit housings connected together by a slideway plate to which a top cover of the body is fixed, said body having a central vertical axis;
- means on said head for securing said head to a support means;
- a piston and cylinder unit in each housing and having a piston rod projecting therefrom normally of said central axis, said piston rods extending in opposite directions;
- a pair of opposed jaw carrier slides each fixed to a respective one of said piston rods and extending between said cover and said slideway plate for sliding movement therebetween;
- a pair of gripper jaw carriers, each depending from a respective one of said slides and having means thereon for the attachment of a gripper jaw for gripping an object to be picked up and placed, in cooperation with the other jaw;
- means for fixedly connecting each slide to a respective one of said piston rods, for movement of said slide away from said central axis upon advance movement of said piston rod, and towards said central axis upon retractile movement of said piston rod; and
- means mounted for free pivotable movement about said central axis and being connected to each slide by way of lost motion means, for ensuring that upon advance movement of said piston rods, the slides and thus the jaw carriers are moved away from each other simultaneously and by the same distance.

16. The gripper head as claimed in claim 15, wherein said jaw carriers are in the form of parallel, flat jaw carrier plated extending normally of said slides, said housings being rectangular and being secured together by said slideway plate in contiguous relationship to provide a rigid rectangular structure, said plates abutting opposite sides of said structure in a fully retracted position of said piston rods.

17. The gripper head as claimed in claim 15, wherein said support means is a Z axis shaft of a pick and place robot, with the axis of the shaft coincident with said central axis and said cover includes means for securing said head to said Z axis shaft.

18. The gripper head as claimed in claim 17, wherein said cover has a flat top surface adapted to receive fasteners for securing thereagainst a plate from which said Z-axis shaft extends normally, said slide plate and said cover having alignment means for ensuring that said central axis coincides with the axis of said Z-axis shaft.

19. The gripper head as claimed in claim 15, wherein said gripper jaws are in an open position for receiving said object and a closed position for gripping said object.

20. The gripper head as claimed in claim 15, wherein said jaws receive said object in said closed position and grip said objects in said open position.

* * * * *